US006181602B1

(12) United States Patent
Campardo et al.

(10) Patent No.: US 6,181,602 B1
(45) Date of Patent: Jan. 30, 2001

(54) DEVICE AND METHOD FOR READING NONVOLATILE MEMORY CELLS

(75) Inventors: Giovanni Campardo, Bergamo; Rino Micheloni, Turate; Alfonso Maurelli, Sulbiate, all of (IT)

(73) Assignee: STMicroelectronics S.r.l., Agrate Brianza (IT)

(*) Notice: Under 35 U.S.C. 154(b), the term of this patent shall be extended for 0 days.

(21) Appl. No.: 09/322,460

(22) Filed: May 28, 1999

(30) Foreign Application Priority Data

May 29, 1998 (EP) .................................. 98830333

(51) Int. Cl.[7] .................................................. G11C 16/06
(52) U.S. Cl. ................................ 365/185.21; 365/185.22
(58) Field of Search .......................... 365/185.2, 185.21, 365/185.01, 189.07, 189.01, 185.22, 207

(56) References Cited

U.S. PATENT DOCUMENTS

| 5,559,737 | * | 9/1996 | Tanaka et al. | 365/185.25 |
|---|---|---|---|---|
| 5,805,500 | * | 9/1998 | Campardo et al. | 365/185.2 |
| 5,901,087 | * | 5/1999 | Pascucci | 365/185.21 |
| 6,021,083 | * | 2/2000 | Shiau et al. | 365/230.01 |

FOREIGN PATENT DOCUMENTS

| 0 417 973 | 3/1991 | (EP) | G11C/7/06 |
|---|---|---|---|
| 0 514 350 | 11/1992 | (EP) | G11C/16/06 |
| 0 814 484 | 12/1997 | (EP) | G11C/16/06 |

* cited by examiner

Primary Examiner—David Nelms
Assistant Examiner—Hoai V. Ho
(74) Attorney, Agent, or Firm—Theodore E. Galanthay; E. Russell Tarleton; Seed IP Law Group PLLC

(57) ABSTRACT

A method for reading memory cells that includes supplying simultaneously two memory cells, both storing a respective unknown charge condition; generating two electrical quantities, each correlated to a respective charge condition of the respective memory cell; comparing the two electrical quantities with each other; and generating a two-bit signal on the basis of the result of the comparison. A reading circuit includes a two-input comparator having two branches in parallel, each branch being connected to a respective memory cell by a current/voltage converter. Both the two-input comparator and the current/voltage converter comprise low threshold transistors.

25 Claims, 5 Drawing Sheets

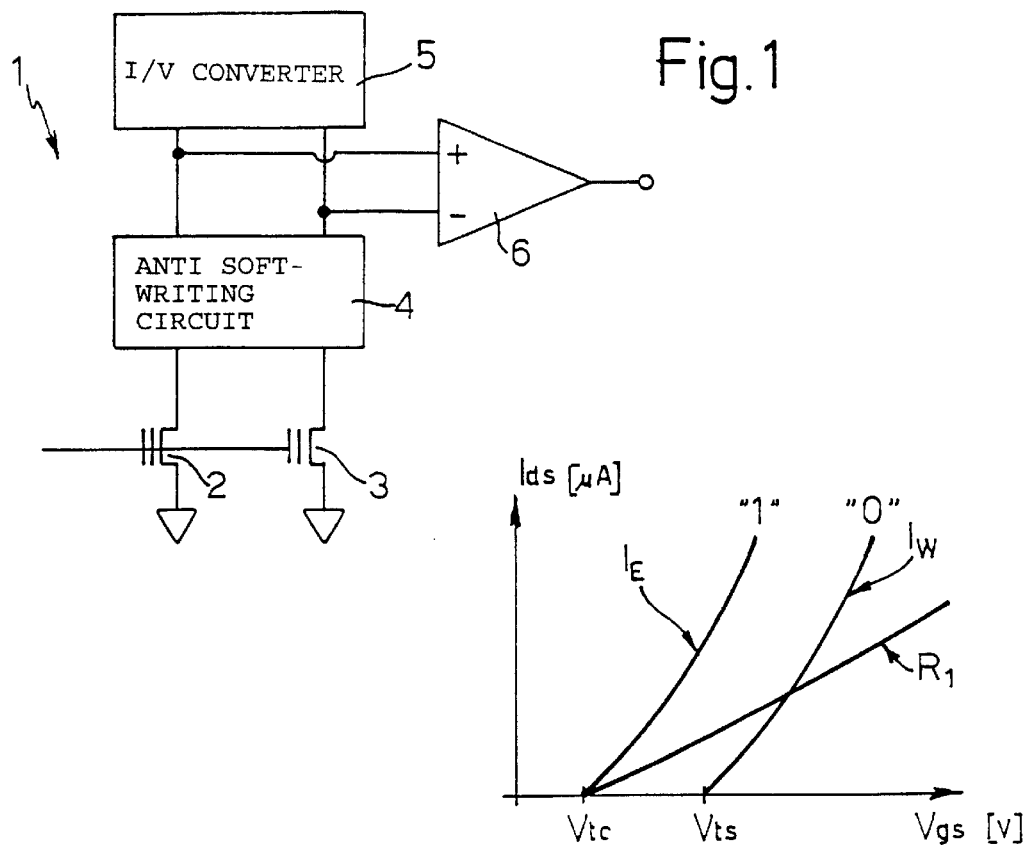
Fig.1
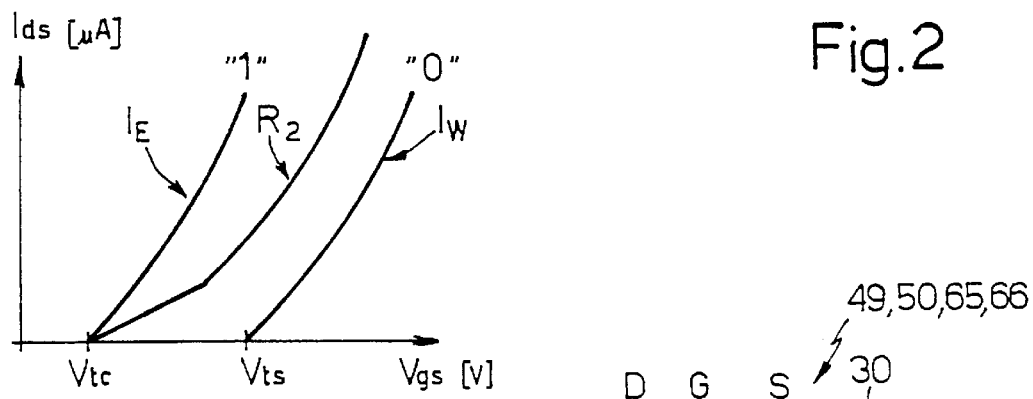
Fig.2
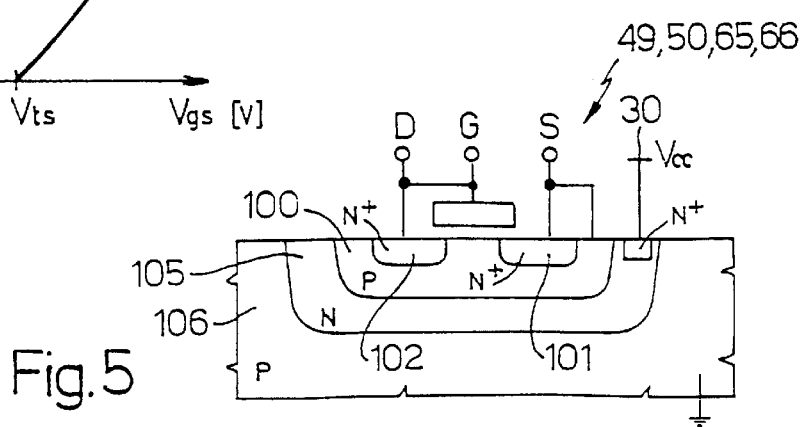
Fig.3
Fig.5

DEVICE AND METHOD FOR READING NONVOLATILE MEMORY CELLS

TECHNICAL FIELD

The present invention relates to a device and a method for reading nonvolatile memory cells.

BACKGROUND OF THE INVENTION

As is known, memory cells are presently read by converting the current flowing into the cell, which is suitably biased, into a voltage, and comparing the voltage thus obtained with a reference voltage generated from a reference cell, the charge state of which is previously known, and is typically a virgin cell. In fact, the read memory cell conducts a different current according to the stored charge condition, and comparison (carried out by a sense amplifier) with the current flowing in the reference cell allows detecting whether the cell is written or erased, and thus whether the stored datum is a "0" or a "1".

FIG. 1 shows a simplified diagram of a reading device (sense amplifier) 1 connected to an array cell 2 to be read, and to a reference cell 3. Sense amplifier 1 comprises a circuit 4 preventing phenomena of soft-writing (spurious writing of the cell), a current-voltage converter 5 and a comparator 6.

Cell read correctness therefore depends to a large extent on the satisfactory operation of the reference cell.

At present in EPROM memories, reference cells are formed inside the memory array, using a column of the array as a reference, one for each output. This solution has some advantages, such as low dispersion of the threshold values of the reference cells compared with the values of the memory cells; simplicity of timing, since the reference cells are biased together with the memory cells; and balance of the branches of the sense amplifier.

However, this solution cannot be applied to flash-type memories, in which it is necessary for the reference cells to have a ground separated from that of the memory cells, to prevent the reference cells from becoming depleted (i.e., overerased) during memory cell erasing (which takes place in sectors). In addition, in flash-type memories, the arrangement of the reference cells inside the memory array would cause stresses for the reference cells themselves, such as to cause cycling problems and to prevent modification of the reference threshold if necessary during the test step, owing to the large number of reference cells. Consequently, in flash memories, the reference cells are gathered in a small array arranged outside the memory array. Thereby, the reference cells can be erased and/or written during the test step, to obtain the best reference possible, which nevertheless is the same for all the sense amplifiers.

In addition, a feature which is essential to obtain correct reading of the memory cells concerns positioning of the characteristic of the reference cell (reference characteristic), compared with the characteristics of written and erased memory cells, taking into account their distribution. In particular, with reference to FIG. 2, the position of the reference characteristic must be intermediate between the characteristic of the worst erased array cell (curve $I_E$, with threshold Vtc) and the characteristic of the worst programmed cell (curve $I_w$, with threshold Vts). To this end, known I/V converters are structured according to two solutions, i.e., unbalance converter, which provides the reference characteristic $R_1$ of FIG. 2, and semi-parallel converter which provides the reference characteristic $R_2$ of FIG. 3.

The two solutions have different fields of application; the first, of FIG. 2, is suitable for memories operating at high supply levels (5V); the second, of FIG. 3, is suitable for memories operating at a low voltage (less than 3V).

In these converters, the main problems are derived from the need to correctly position the reference, and to select accurately the gain of the trans-characteristic of the cell (gain seen externally), by modifying loads of the I/V converter 5. In fact these operations are very delicate and costly as to time; in addition, the reference cell (or plurality of reference cells) is not representative of the entire distribution of the array cells, and thus gives rise to a response distribution by the sense amplifier. Finally, the reference cells do not age like the array cells because they are subject to different stresses, they do not undergo the same program/erase cycles as the array cells, and on the other hand they are biased substantially continually during reading.

Consequently, design and control of the reference cells is difficult and complex.

SUMMARY OF THE INVENTION

The object of the invention is thus to overcome the above described disadvantages.

According to the invention, a device and a method for reading nonvolatile memory cells are provided.

In practice, the reading device according to the invention does not use particular reference cells, having a previously known charge state, but compares with each other two bits read simultaneously, and preferably two bits of a single byte, using them as a dynamic reference for each other.

BRIEF DESCRIPTION OF THE DRAWINGS

For understanding the present invention, a preferred embodiment is now described, purely by way of non-limiting example, with reference to the attached drawings in which:

FIG. 1 shows the circuit diagram of a sense amplifier of known type;

FIGS. 2 and 3 show the characteristics of memory cells and reference cells in two known current/voltage conversion solutions;

FIG. 5 shows a cross-section through a portion of a semiconductor material wafer accommodating a component of the diagram of FIG. 4.

DETAILED DESCRIPTION OF THE INVENTION

Figure 4:
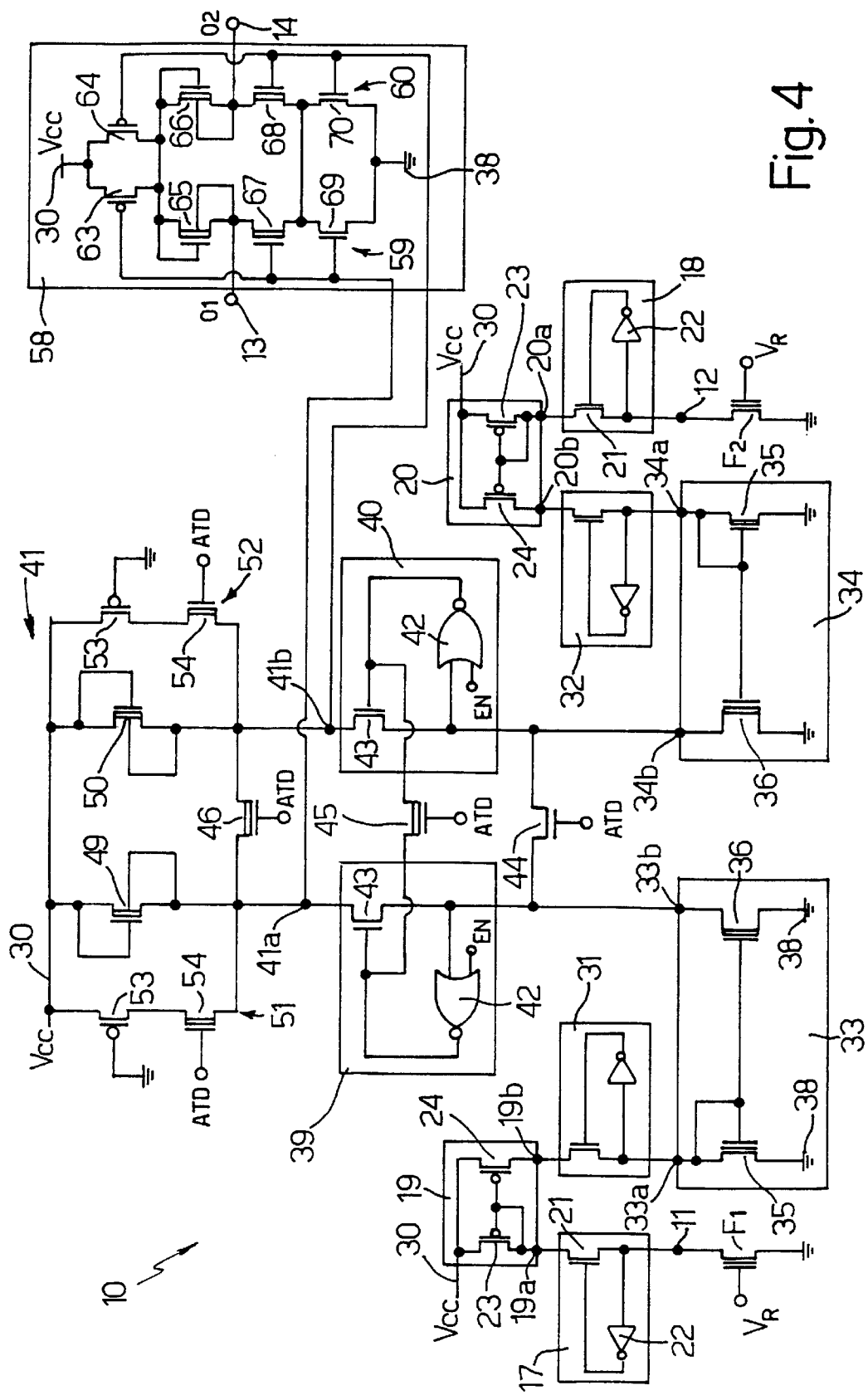
FIG. 4 shows a simplified circuit diagram of the reading device according to the invention.

In FIG. 4, the reading device, indicated generally at 10, has a first and a second input node 11, 12, connected respectively to a memory cell F1 and F2, and a first and a second output node 13, 14 providing respectively output voltages 01 and 02. Cells F1, F2, of nonvolatile type, and in particular of flash type, are preferably cells of a single byte that are read simultaneously, and are biased at their gate terminals by reading voltages $V_R$, which, if the supply voltage has a sufficient value, has the same value as supply voltage Vcc, and otherwise is a boosted supply voltage by an appropriate circuit, in a per se known manner, not discussed in detail.

Each input node 11, 12 is connected by a respective fedback cascode circuit 17, 18, to an input node 19a, 20a of a respective first current mirror circuit 19, 20. Fedback cascode circuits 17, 18 comprise each an NMOS transistor 21, arranged respectively between nodes 11, 19a, and 12, 20a, and an inverter 22 arranged respectively between nodes 11, 12 and the gate terminal of respective NMOS transistor 21. Fedback cascode circuits 17, 18 regulate the voltage present on input node 11, 12, so as to prevent soft-writing phenomena, in a known manner. First current mirror circuits 19, 20 comprise a PMOS transistor 23, diode-connected between nodes 19a, respectively 20a and a supply line 30 set to Vcc, and a transistor 24 connected between supply line 30 and a respective output node 19b, 20b. Transistors 23 and 24 have gate terminals connected to each other. Output nodes 19b, 20b are connected by respective fedback cascode circuits 31, 32, equal to fedback cascode circuits 17, 18, to input nodes 33a, 34a of respective second current mirror circuits 33, 34 of NMOS type, comprising native transistors 35, 36, and thus have a threshold voltage that is lower than that normally provided. In particular, transistor 35 is diode-connected between the respective input node 33a, 34a and ground 38; transistor 36 has a source terminal connected to ground 38 and a drain terminal forming the respective output nodes 33b, 34b. Output nodes 33b, 34b are connected by respective fedback cascode circuits 39, 40 respectively to a first and a second input/output node 41a, 41b of a current/voltage converter circuit 41.

Fedback cascode circuits 39, 40 are similar to fedback cascode circuits 17, 18, except the fact that inverter 22 is replaced by a NOR gate 42, having a first input connected to node 33b, respectively 34b, and an other input receiving an enable signal EN supplied from the exterior. The output of NOR gate 42 is connected to a gate terminal of an NMOS transistor 43 arranged between node 33b, respectively 34b, and nodes 41a, respectively 41b. A first equalization transistor 44 of NMOS type is connected between nodes 33b and 34b, and has a control terminal receiving a signal ATD. A second equalization transistor 45 of native NMOS type, is connected between gate terminals of NMOS transistors 43, and has a control terminal receiving signal ATD. In addition, a third equalization transistor 46, of native NMOS type, is connected between the input/output nodes 41a, 41b of current/voltage converter 41, and has a control terminal receiving signal ATD. Equalization transistors 44–46 operate in known manner to equalize to each other the voltages present on nodes 33b, 34b, and the voltages present on nodes 41a, 41b in the equalization step, when signal ATD (generated on detection of an address transition in the memory comprising the present reading device) has a high value, and are switched off during an actual reading step, such as to allow independent evolution of the two device branches, connected respectively to cell F1 and cell F2, and lead to input/output nodes 41a, 41b, depending on whether cells F1, F2 are written or erased.

Current/voltage converter 41 comprises a pair of load transistors 49, 50 of native NMOS type, diode-connected, and have a source terminal connected to the input node 41a, respectively 41b, a drain terminal connected to supply line 30, a gate terminal connected to the drain terminal, and bulk connected to the source terminal. Load transistors 49, 50 are of triple-well type, as shown in the cross-section of FIG. 5, wherein the bulk of load transistors 49, 50 is shown as comprising a P well 100 accommodating a source region 101 and a drain region 102 of N+-type. P well 100 is electrically connected to source region 101, and is accommodated in an N well 105 biased to Vcc, and in turn is formed in substrate 106, which is grounded. Thereby, the bulk is electrically separated from substrate 106, and has the same potential as source region 101; consequently load transistors 49, 50 have a particularly low threshold voltage, which is not affected by the body effect (according to which the threshold voltage increases when the voltage drop between the body and source regions increases).

A respective bias branch 51, 52 is arranged in parallel with each of the load transistors 49, 50; bias branches 51, 52 are equal to each other, and comprise a PMOS transistor 53 and a native-type NMOS transistor 54; PMOS transistor 53 has a source terminal connected to supply line 30, a gate terminal connected to ground 38, and a drain terminal connected to the drain terminal of NMOS transistor 54; NMOS transistor 54 has a gate terminal receiving signal ATD and a source terminal connected to the respective input/output nodes 41a, 41b. During equalization, when signal ATD is high, bias branches 51, 52 initially set the flowing current, in a known manner, and maintain input/output nodes 41a, 41b at voltage Vcc, less the threshold voltage of a native transistor.

First and second input/output nodes 41a, 41b of current/voltage converter 41 are connected to a comparison circuit 58 comprising a first and a second branch 59, 60 which are equal to each other and are arranged in parallel with each other. In detail, first branch 59 comprises a PMOS transistor 63 and three NMOS transistors 65, 67, 69 connected in series between supply line 30 and ground 38; second branch 60 comprises a PMOS transistor 64 and three NMOS transistors 66, 68, 70, also connected in series between supply line 30 and ground 38. NMOS transistors 65–68 are of native, low-threshold type; PMOS transistor 63 and NMOS transistors 67, 69 of first branch 59 all have a gate terminal connected to the first input/output node 41a; PMOS transistor 64 and NMOS transistors 68, 70 of second branch 60 all have a gate terminal connected to the second input/output node 41b. NMOS transistors 65 and 66 of first and second branch 59, 60 are diode-connected, have bulk connected to the respective source terminal, and are also of triple-well type, as load transistors 49, 50. PMOS transistors 63, 64 of first and second branch 59, 60 have a source terminal connected to supply line 30 and a gate terminal connected to the drain terminal of NMOS transistors 65, 66; the intermediate node between the respective NMOS transistors 65, 67 and 66, 68, forms the first output 13 and, respectively the second output 14 of reading device 10; the source terminal of NMOS transistors 69, 70 is connected to ground 38.

Under normal conditions, when cells F1, F2 belong to a same byte, four reading devices are necessary, with the same structure as the above described reading device 10, for reading the entire byte.

The circuit of FIG. 4 operates as follows.

Memory cells F1 and F2 Both Erased

Figure 6:
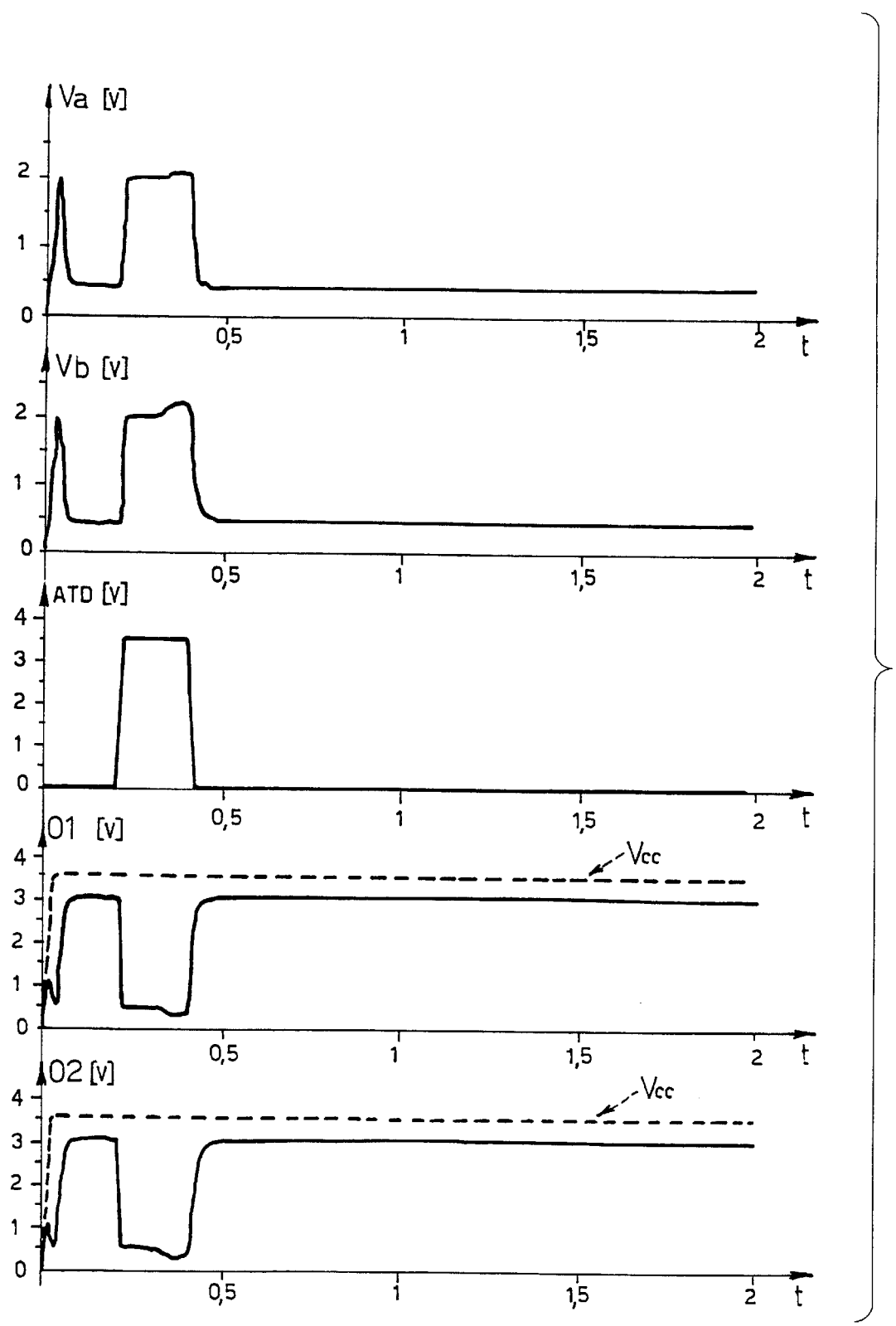
FIGS. 6–8 show plots of electrical quantities measured on the circuit of FIG. 4, in three different reading conditions.

In this case, even if two cells F1 and F2 absorb different currents, the current they absorb is mirrored in first and second current mirror circuits 19, 20 and 33, 34. Then, at the end of the equalization step, when signal ATD becomes low again, the voltage present on input/output nodes 41a, 41b drops approximately to the threshold voltage of NMOS transistors 36 of second current mirror circuits 33, 34, which is very low (about 0.5 V) since NMOS transistors 36 are of native type. Consequently PMOS transistors 63, 64 of comparison circuit 58 switch on, and NMOS transistors 69, 70 switch off. In this condition, PMOS transistors 63, 64 set both outputs 13, 14 to a voltage having the same value as supply voltage Vcc, less the threshold voltage of native NMOS transistors 65, 66 and thus voltages 01 and 02 are both high, corresponding to a logic condition "11" (two-bit logic signal). This situation corresponds to the simulation of FIG. 6, wherein Va is the voltage present at the first input/output node 41a, Vb is the voltage present at the second input/output node 41b, and the other voltages have the meaning already explained.

Memory cells F1 and F2 Both Written

Figure 7:
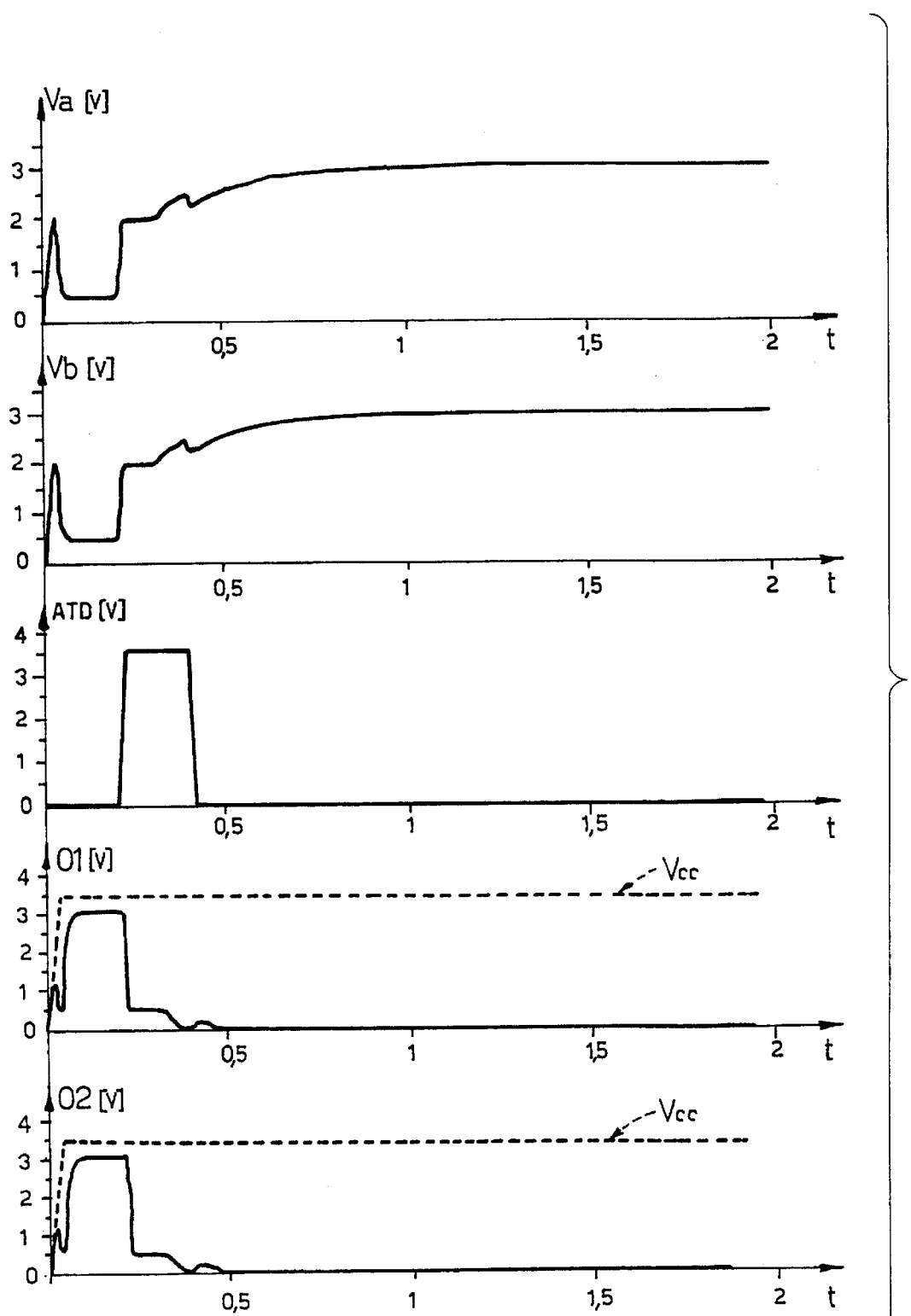

In this case, the cells do not absorb current, or absorb small currents, which may be also different from each other. Even in the worst conditions, the current absorbed by cells F1, F2, and mirrored in the first and second current mirror circuits 19, 20 and 33, 34, is not sufficient to lower the voltage at input/output nodes 41a, 41b, which in fact in ideal conditions goes to its maximum value, equal to supply voltage Vcc less the threshold voltage of native load transistors 49, 50 (0.5 V). Consequently PMOS transistors 63, 64 of comparison circuit 58 remain switched off, and NMOS transistors 67–70 remain switched on. Voltages 01 and 02 at outputs 13, 14 are thus low, corresponding to a logic condition "00". This situation corresponds to the simulation of FIG. 7.

Cells F1 erased and F2 Written

Figure 8:
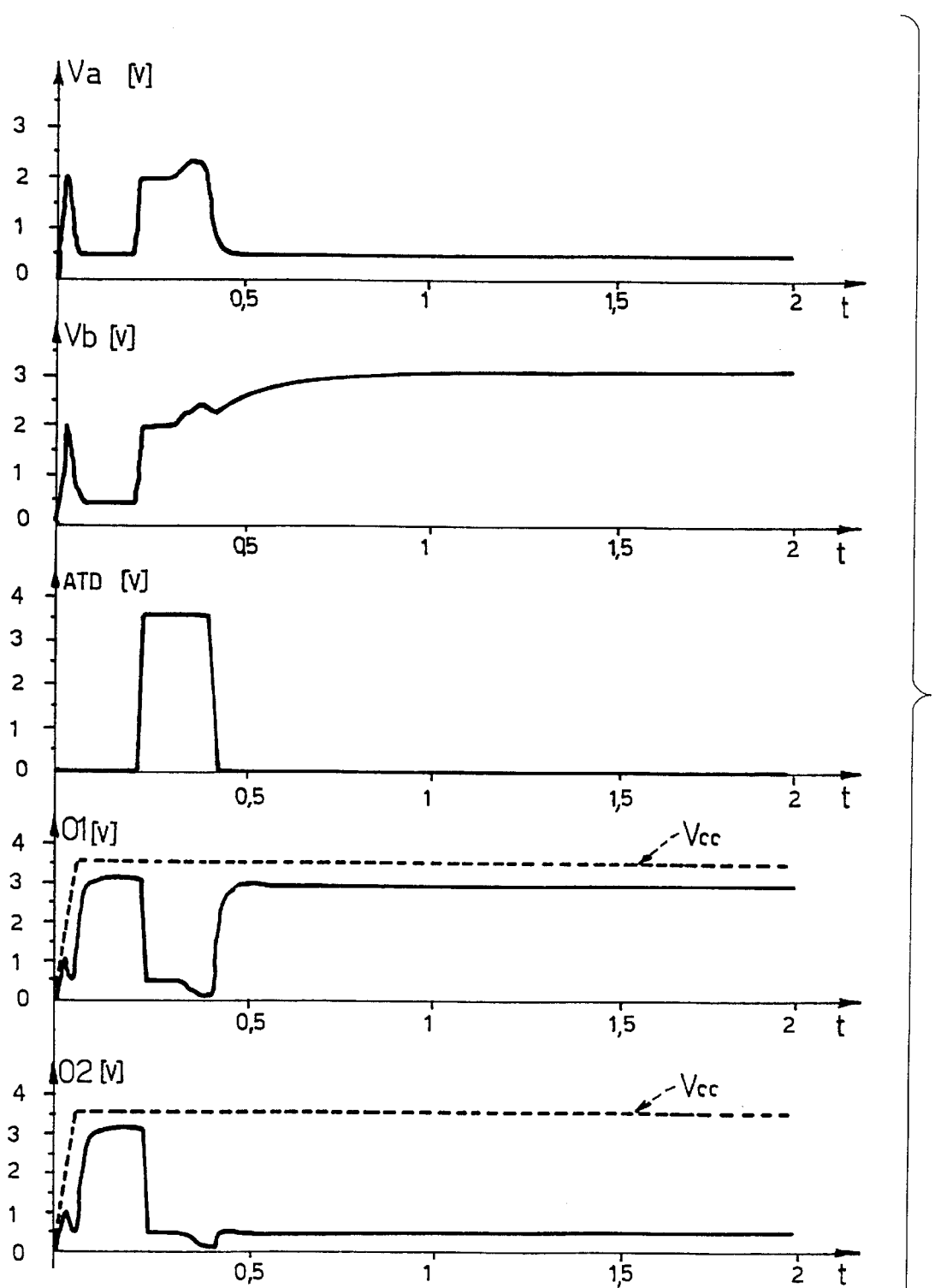

In this case, cell F1 conducts a high current, whereas cell F2 does not conduct current, or conducts little current. Consequently voltage Va at the first input/output node 41a is low, and voltage Vb at the second input/output node 41b is high; PMOS transistor 63 switches on, NMOS transistors 67, 69 are switched off, PMOS transistor 64 remains switched off, and NMOS transistors 69, 70 remain switched on. Voltage 01 at the first output 13 is therefore high, and voltage 02 at the second output 14 is low, corresponding to a logic condition "10". This situation corresponds to the simulation of FIG. 8.

Cells F1 written and F2 Erased

This is a dual situation with respect to the just described one, which leads to logic condition "01".

Voltages 01 and 02 are subsequently advantageously buffered by a structure setting their value to a fully CMOS value.

In practice, with the described device, use of a comparison circuit comparing the content of two memory cells and supplying the result at the output as a two-bit signal, and use of native, low-threshold transistors in the current/voltage converter, as well as in comparison circuit, gives at the output an unambiguous binary signal coding all four possible states (written, erased), stored by two memory cells, the charge state of which is not previously known, unlike known circuits wherein characteristic and positioning of the reference cell or cells must be known accurately.

The advantages of the described device and the method are as follows. Elimination of the reference cell solves the above described problems of criticality, and difficulty of design and control; in addition it allows elimination of all the circuitry necessary for controlling and positioning the memory cell or cells in the EWS (Electrical Wafer Sort) step. Furthermore, it permits time saving in the EWS step, and, for reading an entire byte, requires the use of only four circuits as that described.

Finally, it is apparent that many modifications and variations can be made to the reading device and method described and illustrated here, all of which come within the scope of the invention, as defined in the attached claims.

What is claimed is:

1. A device for reading nonvolatile memory cells, comprising: two input nodes connectable to a respective one of two memory cells storing unknown charge conditions; and a two-input comparator circuit, said two-input comparator circuit having two inputs, each connected to a respective one of said two input nodes, comparing with each other said unknown charge conditions, and generating at an output a two-bit signal coding said unknown charge conditions.

2. The device according to claim 1, wherein said two-input comparator circuit comprises a first and a second branch equal to each other, and connected in parallel between a first and a second reference potential structure; said first branch defining a first one of said two inputs and said second branch defining a second one of said two inputs of said two-input comparator circuit.

3. The device according to claim 2, wherein said first and second branch comprise each a first and a second transistor connected in series to each other, and of complementary type, said first and second transistor of each branch having gate terminals connected together and to a respective one of said first and second inputs of said two-input comparator circuit.

4. The device according to claim 3, wherein each branch of said two-input comparator circuit additionally comprises a third and a fourth transistor connected in series between said first and second transistors; said third and fourth transistors being of low-threshold type, and defining between each other an intermediate node forming a respective output of said two-input comparator circuit.

5. The device according to claim 4, wherein said first reference potential structure is connected to a supply voltage and said first transistor of said first and second branches is connected to said first reference potential structure, said third transistor of said first and second branches is diode-connected between said respective first transistor and the respective output of said two-input comparator circuit and is of triple-well type.

6. The device according to claim 1, further comprising charge detection means arranged between said two input nodes and said two inputs of said two-input comparator circuit and generating electrical quantities correlated to said charge conditions.

7. The device according to claim 6, wherein said charge detection means comprises a current/voltage converter.

8. The device according to claim 7, wherein said current/voltage converter comprises two branches, each branch including at least one load transistor connected between the respective input node and a supply line; said load transistors being diode-connected and being of triple-well type.

9. The device according to claim 8, wherein each branch of said current/voltage converter additionally comprises a first and a second current mirror circuit arranged between the respective input node and the respective load transistor.

10. The device according to claim 9, wherein said current mirror circuits are connected to said respective load transistors and are of low threshold type.

11. A method for reading nonvolatile memory cells, comprising:
    simultaneously supplying two memory cells, both memory cells storing a respective unknown charge condition;
    generating two electrical quantities, said electrical quantities being correlated to a respective one of said unknown charge conditions;
    comparing said two electrical quantities with each other; and
    generating a two-bit signal according to said comparison.

12. A device for reading nonvolatile memory cells, comprising:
    first and second memory cells connected to first and second input nodes, respectively, each memory cell configured to store an unknown charge condition; and a reading circuit coupled to the first and second input nodes and configured to output a two-bit code corresponding to the unknown charge conditions of the first and second memory cells.

13. The device of claim 12, wherein the reading circuit comprises:
   a first pair of current mirrors, each current mirror coupled to a respective input node;
   a second pair of current mirrors, each current mirror coupled to a respective current mirror in the first pair of current mirrors;
   a current-to-voltage converter circuit having first and second input terminals, each input terminal connected to a respective current mirror in the second pair of current mirrors, the converter circuit further including first and second output terminals; and
   a comparison circuit having first and second input terminals, each input terminal connected to a respective output terminal of the converter.

14. The device of claim 13, further comprising a first pair of feedback cascode circuits, each cascode circuit coupled between respective input nodes and respective current mirrors in the first pair of current mirrors and configured to prevent soft-writing of the first and second memory cells.

15. The device of claim 14, further comprising a second pair 3, of fedback cascode circuits, each fedback cascode circuit coupled between respective current mirrors in the first pair of current mirrors and respective current mirrors in the second pair of current mirrors.

16. The device of claim 13, further comprising a second pair of fedback cascode circuits, each fedback cascode circuit coupled between respective current mirrors in the second pair of current mirrors and respective input terminals of the first and second input terminals of the converter circuit; and further comprising a first transistor connected between the first and second output terminals of the second pair of current mirrors, a second transistor connected between the fedback cascode circuits in the second pair of fedback cascode circuits; and a third transistor connected between the first and second input terminals of the converter.

17. A method for reading nonvolatile memory cells, comprising:
   storing a respective unknown charge in first and second memory cells;
   simultaneously reading the first and second memory cells to generate two electrical quantities corresponding to the respective unknown charge conditions of the two memory cells;
   converting the two electrical quantities to two voltages; and
   comparing the two voltages to each other to generate a two-bit signal corresponding to the comparison of the two voltages.

18. The method of claim 17, wherein reading the two memory cells further comprises regulating the electrical quantities to prevent soft-writing of the first and second memory cells.

19. The method of claim 17, wherein reading the first and second memory cells to generate electrical quantities further comprises detection of an address transition in the memory cells and equalizing the electrical quantities to the voltages in response thereto.

20. The method of claim 17, wherein the two-bit signal outputs a "00" logic condition when both memory cells are written, a "11" logic condition when both memory cells are erased, a "10" logic condition when the first memory cell is erased and the second memory cell is written, and a "01" logic condition when the first memory cell is written and the second memory cell is erased.

21. A device for reading nonvolatile memory cells, comprising:
   two input nodes connectable to a respective one of two memory cells storing unknown charge conditions; and
   a two-input comparator circuit, said two-input comparator circuit having two inputs each connected to a respective one of said two input nodes for receiving the unknown charge conditions, the two-input comparator circuit configured to compare with each other the unknown charge conditions and to generate at an output a two-bit signal coding the charge conditions, the two-input comparator circuit comprising a first and second branch equal to each other and connected in parallel between a first and a second reference potential structure, the first branch defining a first one of the two inputs and the second branch defining a second one of the two inputs of the two-input comparator circuit, the first and second branches each comprising a first and a second transistor connected in series to each other and of complementary type, the first and second transistor of each branch having gate terminals connected together and to a respective one of the first and second inputs, and each branch additionally comprising a third and a fourth transistor connected in series between the first and second transistors, the third and fourth transistors being of low-threshold type and defining between each other an intermediate node forming a respective output of the two-input comparator circuit.

22. A device for reading nonvolatile memory cells, comprising:
   two input nodes connectable to a respective one of two memory cells storing unknown charge conditions;
   a two-input comparator circuit having two inputs, each input connected to a respective one of said two input nodes for receiving the unknown charge conditions, the two-input comparator circuit configured to compare with each other the two unknown charge conditions and to generate at an output a two-bit signal coding the unknown charge conditions; and
   a current/voltage converter coupled between the input nodes and the two inputs of the two-input comparator circuit and configured to generate electrical quantities correlated to the charge conditions, the current/voltage converter comprising two branches, each branch including at least one load transistor connected between the respective input node and a supply line, the at least one load transistor being diode-connected and being of triple-well type, and each branch of the current/voltage converter further comprising a first and a second current mere circuit coupled between the respective input node and the respective load transistor.

23. A device for reading nonvolatile memory cells, comprising:
   first and second memory cells connected to first and second input nodes, respectively, each memory cell configured to store an unknown charge condition; and
   a reading circuit coupled to the first and second input nodes and configured to output a two-bit code corresponding to the unknown charge conditions of the first and second memory cells, the reading circuit comprising:
      a first pair of current mirrors, each current mirror coupled to a respective input node;

a second pair of current mirrors, each current mirror coupled to a respective current mirror in the first pair of current mirrors;

a current-to-voltage converter circuit having first and second input terminals, each input terminal connected to a respective current mirror in the second pair of current mirrors, the converter circuit further including first and second output terminals; and a comparison circuit having first and second input terminals, each input terminal connected to a respective output terminal of the converter.

24. A device for reading nonvolatile memory cells, comprising:

first and second memory cells connected to first and second input nodes, respectively, each memory cell configured to store an unknown charge condition;

a reading circuit coupled to the first and second input nodes and configured to output a two-bit code corresponding to the unknown charge conditions of the first and second memory cells, the reading circuit comprising:

a first pair of current mirrors, each current mirror coupled to a respective input node;

a second pair of current mirrors, each current mirror coupled to a respective current mirror in the first pair of current mirrors;

a current-to-voltage converter circuit having first and second input terminals, each input terminal connected to a respective current mirror in the second pair of current mirrors, the converter circuit further including first and second output terminals; and a comparison circuit having first and second input terminals, each input terminal connected to a respective output terminal of the converter; and a pair of cascode circuits, each cascode circuit coupled between respective current mirrors in the second pair of current mirrors and respective input terminals of the first and second input terminals of the converter circuit, and further comprising a first transistor connected between the first and second input terminals of the second pair of current mirrors, a second transistor connected between the cascode circuits in the pair of cascode circuits, and a third transistor connected between the first and second input terminals of the converter.

25. A method for reading nonvolatile memory cells, comprising:

storing a respective unknown charge in first and second memory cells;

reading the first and second memory cells to generate two electrical quantities corresponding to the respective unknown charge conditions of the two memory cells;

converting the two electrical quantities to two voltages; and comparing the two voltages to generate a two-bit signal corresponding to the comparison of the two voltages, wherein the two-bit signal outputs a "00" logic condition when both memory cells are written, a "11" logic condition when both memory cells are erased, a "10" logic condition when the first memory cell is erased and the second memory cell is written, and a "01" logic condition when the first memory cell is written and the second memory cell is erased.

\* \* \* \* \*